(12) United States Patent
Bridges et al.

(10) Patent No.: US 8,902,611 B2
(45) Date of Patent: Dec. 2, 2014

(54) INTEGRATED CIRCUIT RETENTION MECHANISM WITH RETRACTABLE COVER

(75) Inventors: Jeremy S. Bridges, Apex, NC (US);
Steven C. Jacobson, Mebane, NC (US);
Luke D. Remis, Raleigh, NC (US);
Gregory D. Sellman, Morrisville, NC (US)

(73) Assignee: International Business Machines Corporation, Armonk, NY (US)

( * ) Notice: Subject to any disclaimer, the term of this patent is extended or adjusted under 35 U.S.C. 154(b) by 167 days.

(21) Appl. No.: 13/610,923

(22) Filed: Sep. 12, 2012

(65) Prior Publication Data

US 2014/0071647 A1   Mar. 13, 2014

(51) Int. Cl.
*H05K 7/02*  (2006.01)

(52) U.S. Cl.
USPC .......................................................... 361/807

(58) Field of Classification Search
CPC ..................................................... H05K 7/142
USPC ........................................................ 361/807
See application file for complete search history.

(56) References Cited

U.S. PATENT DOCUMENTS

| | | | |
|---|---|---|---|
| 5,049,728 A | 9/1991 | Rovin | |
| 5,064,968 A | 11/1991 | Kovacs et al. | |
| 5,161,983 A * | 11/1992 | Ohno et al. | 439/71 |
| 5,727,958 A * | 3/1998 | Chen | 439/136 |
| 6,315,584 B1 | 11/2001 | Greenside et al. | |
| 7,265,990 B2 * | 9/2007 | Wang et al. | 361/740 |
| 7,283,368 B2 * | 10/2007 | Wung et al. | 361/719 |
| 7,289,335 B2 * | 10/2007 | Callahan et al. | 361/803 |
| 7,323,775 B2 | 1/2008 | Wang | |
| 7,766,676 B2 | 8/2010 | Hsieh et al. | |
| 7,957,148 B1 * | 6/2011 | Gallarelli et al. | 361/719 |
| 2002/0044675 A1 | 4/2002 | Chikazawa et al. | |
| 2004/0219808 A1 | 11/2004 | McClellan | |
| 2005/0068741 A1 * | 3/2005 | Bailey et al. | 361/719 |
| 2005/0264675 A1 | 12/2005 | Enomoto | |
| 2007/0149016 A1 | 6/2007 | Xu et al. | |
| 2009/0268402 A1 | 10/2009 | Hanson et al. | |
| 2010/0157563 A1 * | 6/2010 | Llapitan et al. | 361/807 |
| 2011/0134606 A1 | 6/2011 | Gallarelli et al. | |

* cited by examiner

*Primary Examiner* — Forrest M Phillips
(74) *Attorney, Agent, or Firm* — Katherine S. Brown; Jeffrey L. Streets

(57) ABSTRACT

A computer processor retention device comprises a load frame, a load plate, and a pair of retractable cover members. The load frame may be secured to a circuit board around a processor mounting site. The load plate is pivotally coupled to the load frame and is pivotable between being open for receiving a processor at the processor mounting site and closed in engagement with a periphery of the received processor. The load plate has a window that is open to the processor mounting site when the load plate is closed. The retractable cover members span the window and are alternately movable along a track toward one another to cover the processor mounting site and away from one another to expose the processor mounting site.

18 Claims, 5 Drawing Sheets

INTEGRATED CIRCUIT RETENTION MECHANISM WITH RETRACTABLE COVER

BACKGROUND OF THE INVENTION

1. Field of the Invention

The present invention relates to the mounting of an integrated circuit to a circuit board, and more specifically to a retention device for releasably mounting a processor on a computer motherboard.

2. Background of the Related Art

A printed circuit board (PCB) is a structure having electrical communication pathways formed on an electrically insulating substrate used to support and connect a plurality of electronic components. A printed circuit board populated with electronic components may be referred to as a printed circuit board assembly (PCBA). A motherboard or system board refers to the primary PCBA in a computer system. Motherboard components often include integrated circuits (ICs), such as processors and BIOS chips, as well as electronic connectors for interfacing with additional components. Integrated circuits are typically put into protective packages to allow easy handling and assembly onto printed circuit boards and to protect the integrated circuits from damage. A large number of different types of package exist, many of which have standardized dimensions and tolerances. Electronic components commonly include an arrangement of electrical contacts on the package which are to be connected to corresponding electrical contacts on the PCB when the components are mounted on the PCB.

Numerous technologies are known in the art for mounting integrated circuits to a circuit board. Many of these technologies fall under one of the two general categories of through-hole and surface-mount technologies (SMT). In through-hole mounting, the electrical contacts on an electronic component are pins that get inserted through conductive through holes on the PCB. The pins may be soldered in place or have friction-fit with plated through holes, for example. Surface-mount type connections have largely replaced through-hole type connections due to several advantages associated with reducing or eliminating the use of through holes on the PCB. For instance, a surface-mount component can usually be made smaller than its through-hole mounted equivalent, which allows for a higher component density on a PCB. The reduction or elimination of through holes also can result in a lower set-up and production time, faster assembly, lower electrical resistance at the connection, better mechanical performance, and reduced cost.

BRIEF SUMMARY OF THE INVENTION

A computer processor retention device includes a load frame, a load plate pivotally coupled to the load frame and having a window, and a pair of cover members movably secured to the load plate on a track. The load frame is configured for being secured to a circuit board around a processor mounting site. The cover members span the window of the load plate and are alternately movable along the track toward one another to cover the processor mounting site and away from one another to expose the processor mounting site.

A printed circuit board assembly includes a load frame secured to a circuit board around a processor mounting site. A load plate is pivotally coupled to the load frame and is pivotable between being open for receiving a processor at the processor mounting site and being closed in engagement with a periphery of the received processor. The load plate has a window that is open to the processor mounting site when the load plate is closed. A pair of cover members is secured to the load plate on a track. The cover members span the window of the load plate and are alternately movable along the track toward one another to cover the processor mounting site and away from one another to expose the processor mounting site.

DETAILED DESCRIPTION OF THE INVENTION

An integrated circuit retention mechanism for retaining an integrated circuit at a mounting site on a PCB is disclosed. The apparatus and its use are described in the context of a processor, such as a central processing unit ("CPU"), to be retained in a socket. However, the disclosed apparatus and methods may be similarly adapted for use with other types of integrated circuits and integrated circuit positioning structures other than a socket. The retention mechanism has a retractable cover that is normally closed to cover and protect the socket, pins, or other structural features at the mounting site when the processor is not received within the retention mechanism. The retractable cover may include one or more cover members mounted on a track which, when retracted, cover the mounting site. The one or more cover members may be moved along the track for selectively exposing a heat spreader on the processor, such as to install a heat sink on the PCB in contact with the heat spreader. A disclosed example embodiment includes a pair of (i.e. two) cover members which, when closed, are positioned abutting to or very close to one another, and which may be moved apart in opposite directions to expose the heat spreader on the processor. The cover members may be biased toward the closed position using one or more springs. The permanently mounted, retractable cover may remain as a permanent component of the retention mechanism so that it is always available for protecting the socket.

Figure 1:
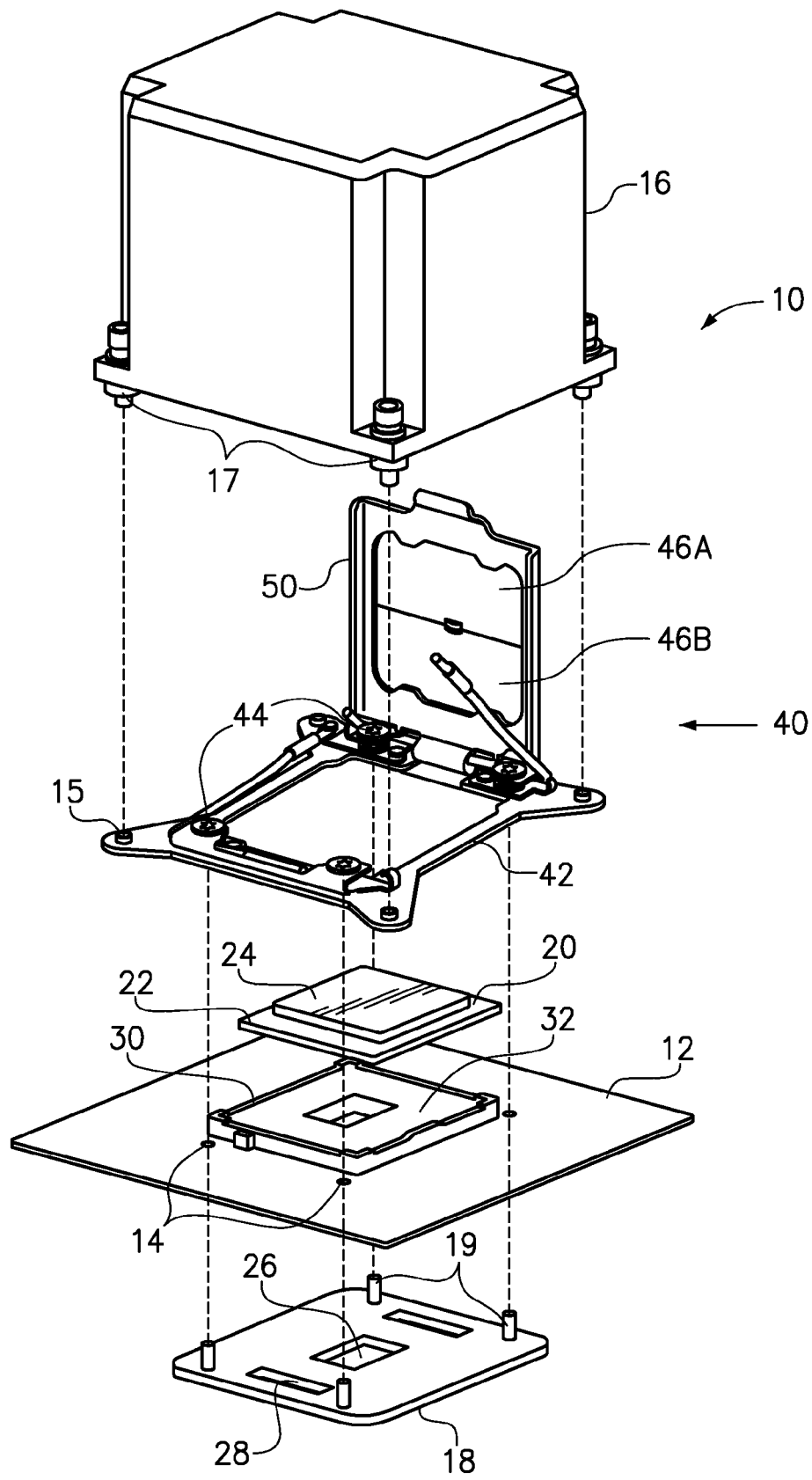
FIG. 1 is an exploded, perspective view of a printed circuit board assembly including a retention mechanism for releasably surface-mounting a processor.

FIG. 1 is an exploded, perspective view of a printed circuit board assembly (i.e. PCBA) 10 including a retention mechanism 40 for releasably surface-mounting a processor 20 at a processor mounting site of a printed circuit board (i.e. PCB) 12. A socket 30 included in this embodiment provides a specific type of structure for mounting the processor at the processor mounting site on the PCB 12. The socket 30 includes a plurality of socket contacts 32, and the socket 30 receives the processor 20 at a very particular position and orientation of the processor 20 for proper alignment between standard electrical contacts on the processor 20 and the corresponding plurality of socket contacts 32.

The retention mechanism 40 includes a load plate 50 pivotally coupled to a load frame 42. The load plate 50 is open in FIG. 1 to allow the processor 20 to be received in the socket 30 or withdrawn from the socket 30. Subsequently closing and latching the load plate 50 to the load frame 42 about the processor 20 that is properly positioned in the socket 30 fully seats and retains the processor 20, by engaging a periphery of the processor 20 and urging the electrical contacts on the processor 20 into contact with the socket contacts 32.

By way of example, the socket contacts 32 in this embodiment are a land grid array (LGA) 32, which is a type of surface-mount packaging wherein the contacts are pins that are provided on the socket 30 rather than pins on the integrated circuit. Though an LGA type socket 30 is depicted for mounting the processor 20 in this embodiment, it should be recognized that an alternate embodiment of a retention mechanism may be constructed consistent with the present teachings for use with other socket types. An alternate embodiment of a retention mechanism may even be constructed that omits the use of what is conventionally regarded as being a socket. For example, rather than using a conventional socket, an LGA or other array of electrical contacts may be provided directly on a motherboard and an alignment feature other than a socket may be used for positioning the processor with respect to the LGA or other array of electrical contacts.

In assembling the PCBA 10 of FIG. 1, the socket 30 may first be secured to the PCB 12 empty (i.e. with no processor installed), using any suitable manufacturing process, such as by soldering the socket 30 to the PCB 12. The PCB 12 is sandwiched between the retention mechanism 40 on one side of the PCB 12 and a backplate 18 on the other side of the PCB 12. The retention mechanism 40 is secured to the PCB 12 over the empty socket 30, by passing a plurality of captive fasteners 44 on the load frame 42 through mounting holes 14 on the PCB 12 and securing the captive fasteners 44 to threaded studs 19 on the backplate 18. The use of a backplate 18 is particularly suitable for square and relatively narrow retention mechanisms, but is not required in all embodiments. The use of the backplate 18 may provide reduced board bending and correspondingly higher solder joint reliability. Additional features of the backplate 18 include a clearance hole 26 at the center to allow access to test points and additional cutouts 28 providing clearance for backside voltage regulator components.

The retention mechanism 40 has a permanently-mounted, retractable cover comprising a pair of movable cover members 46A, 46B. The cover members are normally biased toward a closed position abutting or very close to one another, to cover and protect the empty socket 30. The cover members 46A, 46B comprise thin, flat cover plates in this embodiment (not to be confused with the term "load plate"), which helps minimize the stack height of the PCBA 10. When there is no processor received in the socket 30, the pair of cover members 46A, 46B will be in a closed position to cover the empty socket 30. After the processor 20 is subsequently placed in the socket 30 and the load plate 50 has been closed and latched, the pair of cover members 46A, 46B may be moved apart to selectively expose the processor 20.

The processor 20 may include an electrically insulating substrate 22 and a heat spreader 24 formed directly on the substrate 22. The cover members 46A, 46B are shown closed in FIG. 1, and may be moved apart to expose the heat spreader 24 for engagement by a heatsink 16. The heatsink 16 may be installed in the PCBA 10 in thermal engagement with the heat spreader 24. In this embodiment, the heatsink 16 may be secured directly to the load frame 42 of the retention mechanism 40, for example using threaded fasteners 17 that are threadedly engaged with corresponding heatsink mounting holes 15 on the load frame 42. The heat sink 16 may be in direct physical contact with the heat spreader 24 of the processor 20 or may be in contact with thermal grease applied to the heat spreader 24.

Figure 2:
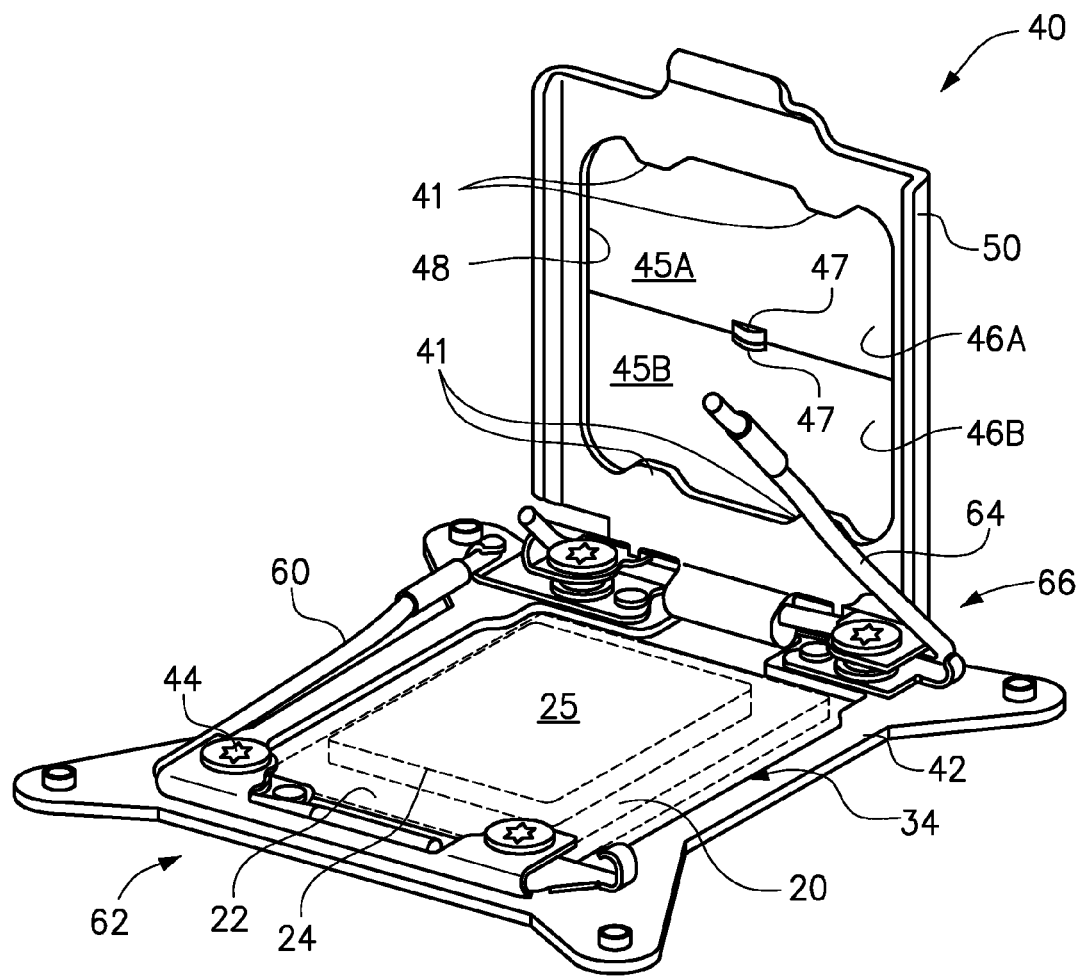
FIG. 2 is an enlarged perspective view of the retention mechanism shown from the same perspective as FIG. 1.

FIG. 2 is an enlarged view of the retention mechanism 40 shown from the same perspective as FIG. 1 but separate from the rest of the assembly of FIG. 1. An outline of the processor 20 in an installed position is shown for reference. The frame 42 has a generally rectangular structure that is open for extending around a perimeter edge of the processor 20 at the processor mounting site 34. Two levers for closing and latching the load plate 50 are referred to herein as a front lever 60 and a rear lever 64. The load frame 42 provides a front hinge location 62 for the front lever 60 and a rear hinge location 66 for the rear lever 64. A portion of the rear lever 64 pivotally couples the load plate 50 to the load frame 42 in this embodiment. These levers 60, 64 are configured to apply substantially equal force at opposite ends of the load plate 50 for uniformly seating the processor 20. When closed, the load plate 50 applies four point loads onto the periphery of a processor using load plate features referred to as fingers 41. This four-point loading provides a more uniform load distribution as compared to two point loading, contributing to minimizing processor and socket warping. The reaction force from closing the load plate 50 is transmitted to the load frame 42 and through the four captive fasteners 44 to the back plate (see FIG. 1). Some of the load is passed through the socket body to the PCB inducing a slight compression on the solder joints.

With the load plate 50 open as shown in FIG. 2, an underside of the load plate 50 and inner surfaces 45A, 45B of the cover members 46A, 46B can be seen. When the load plate 50 is closed and latched, the inner surfaces 45A, 45B of the cover members may be spaced from the outer surface 25 of the heat spreader 24 throughout a range of movement of the cover members 46A, 46B. The load plate 50 has a window 48 through which the heat sink may engage the heat spreader 24, as discussed in reference to FIG. 1. The cover members 46A, 46B span the window 48 and are biased toward one another to "close" the window 48 and to cover the processor mounting site 34 when the load plate 50 is subsequently closed and latched. The cover members include tiny features referred to as tabs 47 that are engage an outer surface 25 of the heat spreader 24 of the processor 20 when the load plate 50 is closed and latched. This engagement of the heat spreader 24 by the tabs 47 when the load plate 50 is closed and latched causes an allowable, slight elastic deformation (i.e. flexing) of the cover members 46A, 46B. When the cover members 46A, 46B are subsequently manually spread apart, the tabs 47 may clear the heat spreader 24, allowing the cover members to relax (i.e. no longer flexing). The tabs 47 on the cover members will then catch on outer edges of the heat spreader 24 to hold the cover members 46A, 46B open. In another embodiment, the tabs 47 may be omitted, and the cover members 46A, 46B may instead be positioned closely enough to the processor 20 to cause light frictional contact between the inner surfaces 45A, 45B and the heat spreader 24.

Figure 3:
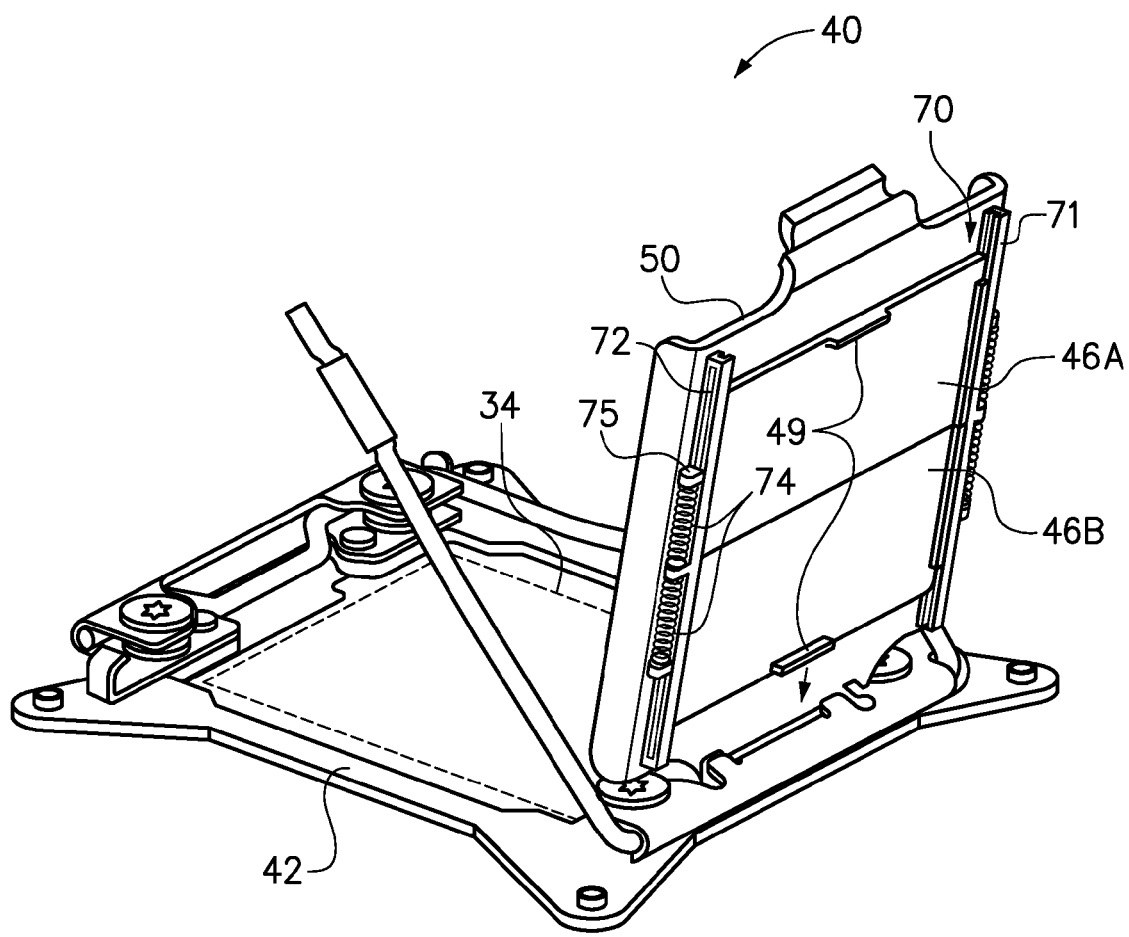
FIG. 3 is an enlarged perspective view of the retention mechanism from another perspective showing the top of the load plate and the attached cover members.

FIG. 3 is an enlarged view of the retention mechanism 40 from another perspective, showing the top of the load plate 50 and the attached cover members 46A, 46B. The cover members 46A, 46B are movably secured to the load plate 50 on a track 70. The track 70 comprises first and second parallel track rails 71, 72, which are secured parallel to one another at opposite sides of the load plate 50, adjacent to the window 48 (see FIG. 2). The track rails 71, 72 movably secure the outer side edges of the cover members 46A, 46B, so that the cover members may be moved in translation in the same plane, in a direction generally parallel to a plane of the load plate 50 and parallel to the heat spreader. Finger tabs 49 are provided on the cover members 46A, 46B allowing a user to move the cover members along the track 70.

Figure 4:
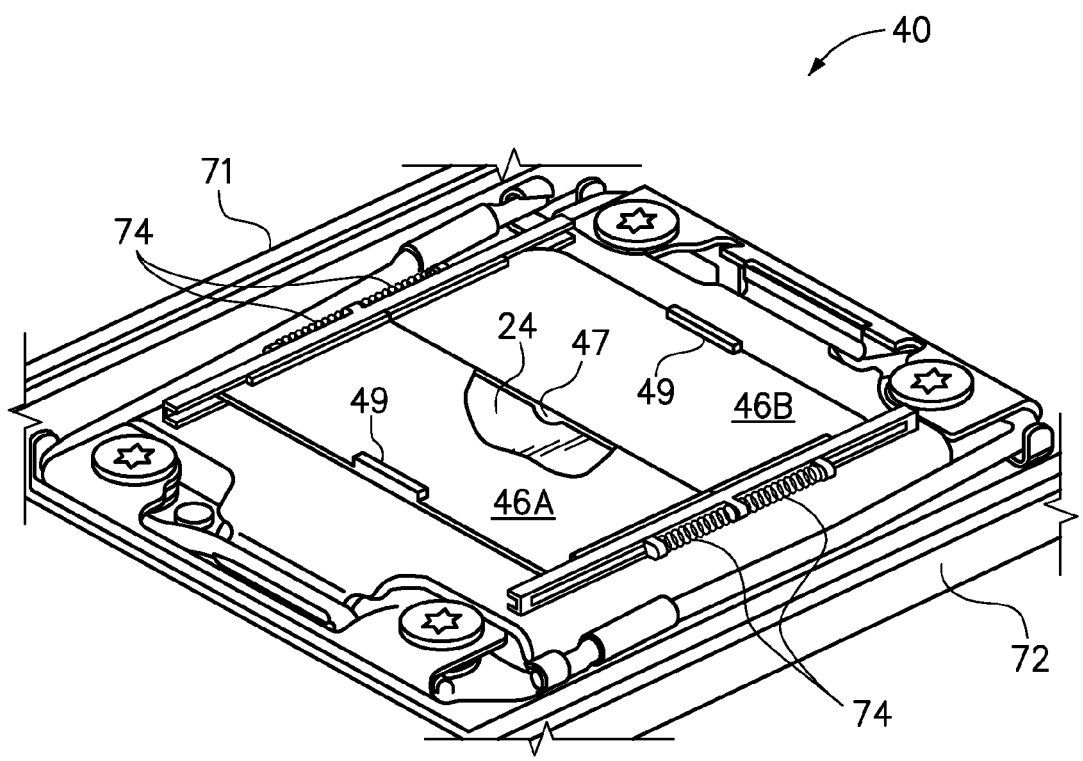
FIG. 4 is a perspective view of the retention mechanism with the load plate closed and the cover members temporarily closed over the processor at the processor mounting site.

A plurality of spring elements, referred to simply as springs 74, are coupled to the cover members 46A, 46B. The springs 74 are shown in this view on one of the track rails 72, and an identical set of springs may be provided on the other track rail 71. The springs 74 bias the cover members toward one another to close the cover members and cover the processor mounting site 34. The springs 74 are optionally coil type springs, as depicted in FIG. 3. Each spring 74 may couple spring stops 75 along an outer side edge of the cover members 46A, 46B to fixed points on the nearest track rail 71, 72 or on the load plate 50 so that moving the cover members 46A, 46B apart places the springs 74 in tension to bias the cover members 46A, 46B back toward one another. In an alternative embodiment, the springs 74 could directly couple one cover member 46A to the other cover member 46B, which would also place the springs 74 in tension to bias the cover members 46A, 46B back toward one another. In yet another embodiment, the springs could be coupled between a fixed location on the load plate 50 and the cover members 46A, 46B so that moving the cover members 46A, 46B apart places the springs in compression to bias the cover members 46A, 46B back toward one another FIG. 4 is a perspective view of the retention mechanism 40 with the load plate 50 closed and the cover members 46A, 46B closed by the springs 74 to cover the processor at the processor mounting site. The springs 74 are relaxed or in a state of minimum spring tension within the normal range of movement of the cover members 46A, 46B. The cover members 46A, 46B are covering the processor so that the processor is hidden from view. Alternatively, if the socket was empty, the cover members 46A, 46B would be covering the empty socket to protect the socket contacts.

With the cover members 46A, 46B closed over the processor, the cover members 46A, 46B frictionally engage the heat spreader, possibly with the allowable, light flexing of the cover members 46A, 46B, as discussed above. A partial cutout of the cover member 46A is used in FIG. 4 in order to better show that when tabs 47 are used (See tabs 47 in FIG. 2), the tabs may be the primary point of contact between the cover members 46A, 46B and the heat spreader 24. To expose the processor, the cover members 46A, 46B may be moved apart manually using the finger tabs 49, overcoming the light friction force between the cover members 46A, 46B and the heat spreader.

Figure 5:
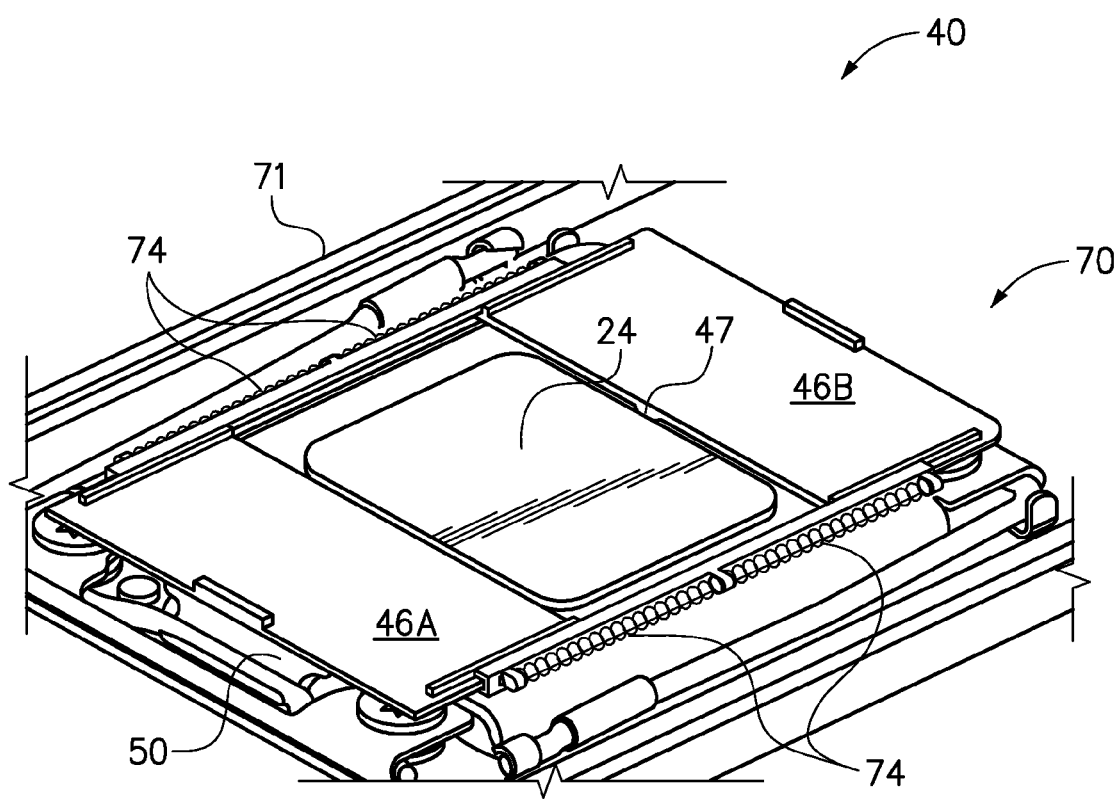
FIG. 5 is a perspective view of the retention mechanism with the load plate still closed and the cover members moved apart to expose the heat spreader of the processor.

FIG. 5 is a perspective view of the retention mechanism 40 with the load plate 50 still closed and the cover members 46A, 46B moved apart to expose the heat spreader 24 of a processor that is operable installed in its socket. As schematically shown, the springs 74 are now elongated by having moved the cover members 46A, 46B outwardly along the track, and are now in a state of increased spring tension that biases the cover members 46A, 46B back toward one another. However, with the cover members 46A, 46B having cleared the outer edge of the heat spreader 24, the cover members 46A, 46B flex back down and are now caught, with or without having tabs 47, on the outer edges of the heat spreader 24 to hold the cover members 46A, 46B apart. With the cover members 46A, 46B held apart through contact with the heat spreader as shown, the heatsink may then be installed, as discussed with reference to FIG. 1. When the load plate 50 is subsequently opened, for example pivotally opened as shown in FIGS. 1-3, the cover members 46A, 46B will be moved clear of the heat spreader 24 and the tension in the springs 74 will automatically close the cover members 46A, 46B, i.e. move the cover members 46A, 46B back toward one another. The automatic retraction of the cover members 46A, 46B ensures that if the socket is empty when the load plate 50 is closed, then the empty socket will be automatically covered and protected, unless a user deliberately moves the cover members 46A, 46B apart. The retractable cover 70 remains permanently secured to the load plate 50 so that it is always available for protecting the socket.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer processor retention device, comprising:
 a load frame configured for being secured to a circuit board around a processor mounting site;
 a load plate pivotally coupled to the load frame and having a window; and
 a pair of cover members secured to the load plate on a track, the cover members spanning the window of the load plate and alternately movable along the track toward one another to cover the processor mounting site and away from one another to expose the processor mounting site, wherein the pair of cover members include a tab on an inner surface of each cover member, and wherein each tab frictionally engages a top surface of a heat spreader on the received processor when the cover members are positioned together to cover the processor mounting site and each tab clears the heat spreader when the cover members are positioned apart to expose the processor mounting site.

2. The computer processor retention device of claim 1, further comprising:
 one or more spring elements coupled to the cover members and biasing the cover members toward one another to cover the processor mounting site.

3. The computer processor retention device of claim 2, wherein the one or more spring elements are coupled to edges of the cover members and a fixed point on the load plate to pull the cover members toward one another along the track under spring tension.

4. The computer processor retention device of claim 1, wherein the track comprises first and second track rails mounted parallel to one another at opposite sides of the processor mounting site; and wherein each cover member comprises a flat plate coupled at a first side to the first track rail and at an opposite second side to the second track rail.

5. The computer processor retention device of claim 1, wherein the cover members are configured to elastically deform when the tabs engage the outer surface of the heat spreader.

6. The computer processor retention device of claim 1, further comprising:
   a processor socket comprising a plurality of electrical contacts at the processor mounting site, wherein the load frame is shaped to fit around the processor socket.

7. The computer processor retention device of claim 6, further comprising:
   one or more lever pivotally coupled to the load plate for urging the load plate against the processor.

8. A computer processor retention device comprising:
   a load frame configured for being secured to a circuit board around a processor mounting site;
   a load plate pivotally coupled to the load frame and having a window; and
   a pair of cover members secured to the load plate on a track, the cover members spanning the window of the load plate and alternately movable along the track toward one another to cover the processor mounting site and away from one another to expose the processor mounting site wherein the cover members further comprise an inner surface spaced from the outer surface of the heat spreader throughout a range of movement of the cover members on the track, and wherein the inner surface of the cover members frictionally contacts the outer surface of the heat spreader when the cover members are positioned to cover the processor mounting site and the load plate is closed.

9. The computer processor retention device of claim 8, further comprising:
   one or more spring elements coupled to the cover members and biasing the cover members toward one another to cover the processor mounting site.

10. The computer processor retention device of claim 9, wherein the one or more spring elements are coupled to edges of the cover members and a fixed point on the load plate to pull the cover members toward one another along the track under spring tension.

11. The computer processor retention device of claim 8, wherein the cover members are configured to elastically deform when the tabs engage the outer surface of the heat spreader.

12. A circuit board assembly, comprising:
   a load frame secured to a circuit board around a processor mounting site;
   a load plate pivotally coupled to the load frame and having a window; and
   a pair of cover members secured to the load plate on a track, the cover members spanning the window of the load plate and alternately movable along the track toward one another to cover the processor mounting site and away from one another to expose the processor mounting site, wherein the pair of cover members include a tab on an inner surface of each cover member, wherein each tab frictionally engages a top surface of a heat spreader on the received processor when the load plate is closed and the cover members are positioned together to cover the processor mounting site, and wherein each tab clears the heat spreader when the cover members are positioned apart to expose the processor mounting site.

13. The circuit board assembly of claim 12, further comprising:
   one or more spring elements coupled to the cover members and biasing the cover members toward one another to cover the processor mounting site.

14. The circuit board assembly of claim 13, wherein the one or more spring elements are coupled to edges of the cover members and a fixed point on the load plate to pull the cover members toward one another along the track under spring tension.

15. The circuit board assembly of claim 12, wherein the cover members are configured to elastically deform when the tabs engage the outer surface of the heat spreader.

16. The circuit board assembly of claim 12, further comprising:
   a processor socket comprising a plurality of electrical contacts at the processor mounting site, wherein the load frame is shaped to fit around the processor socket.

17. The circuit board assembly of claim 16, further comprising:
   one or more lever pivotally coupled to the load plate for urging the load plate against the processor.

18. The circuit board assembly of claim 12, wherein the track comprises first and second track rails mounted parallel to one another at opposite sides of the processor mounting site; and wherein each cover member comprises a flat plate coupled at a first side to the first track rail and at an opposite second side to the second track rail.

* * * * *